United States Patent
Balasubramanian (10) Patent No.: US 9,847,884 B2
(45) Date of Patent: Dec. 19, 2017

(54) NEGOTIABLE POE VOLTAGE FOR IMPROVED EFFICIENCY BASED ON CABLE AND POWERED DEVICE LOSSES

(71) Applicant: Cisco Technology, Inc., San Jose, CA (US)

(72) Inventor: Koussalya Balasubramanian, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 161 days.

(21) Appl. No.: 14/532,148

(22) Filed: Nov. 4, 2014

(65) Prior Publication Data

US 2016/0127135 A1    May 5, 2016

(51) Int. Cl.
| | |
|---|---|
| H04L 12/10 | (2006.01) |
| H04L 12/40 | (2006.01) |
| G06F 1/26 | (2006.01) |
| H04L 12/26 | (2006.01) |
| G01R 27/08 | (2006.01) |
| G01R 31/08 | (2006.01) |

(52) U.S. Cl.
CPC .............. *H04L 12/10* (2013.01); *G06F 1/266* (2013.01); *H04L 12/40045* (2013.01); *G01R 27/08* (2013.01); *G01R 31/086* (2013.01); *H04L 43/50* (2013.01)

(58) Field of Classification Search
CPC ......... G06F 1/266; H04L 12/10; H04L 43/50; G01R 31/086; G01R 27/08
See application file for complete search history.

(56) References Cited

U.S. PATENT DOCUMENTS

| | | |
|---|---|---|
| 5,406,260 A | 4/1995 | Cummings et al. |
| 6,650,622 B1 | 11/2003 | Austerman, III et al. |
| 7,353,407 B2 | 4/2008 | Diab et al. |
| 7,457,250 B2 | 11/2008 | Austermann, III et al. |
| 8,155,012 B2 | 4/2012 | Austermann, III et al. |
| 8,793,511 B1 | 7/2014 | Bishara |
| 2006/0168459 A1* | 7/2006 | Dwelley ................. H04L 12/10  713/300 |
| 2007/0170909 A1* | 7/2007 | Vorenkamp ............. G06F 1/266  324/76.11 |
| 2008/0129118 A1* | 6/2008 | Diab ....................... H04L 12/10  307/35 |
| 2011/0241425 A1 | 10/2011 | Hunter, Jr. et al. |
| 2012/0250784 A1 | 10/2012 | Austerman, III et al. |
| 2013/0002047 A1 | 1/2013 | Austerman, III et al. |
| 2013/0002369 A1 | 1/2013 | Austerman, III et al. |
| 2013/0010846 A1 | 1/2013 | Austerman, III et al. |

(Continued)

*Primary Examiner* — Terrell Johnson
(74) *Attorney, Agent, or Firm* — Edell, Shapiro & Finnan, LLC (57) ABSTRACT

A powered device (PD) receives a Power-over-Ethernet (PoE) voltage to power the PD over a cable from Power Source Equipment (PSE) configured to output a requested one of multiple candidate PoE voltages to the cable. The PD determines a preferred PoE voltage among the multiple candidate PoE voltages that minimizes a total power loss due to (i) the cable, and (ii) a power loss of the PD that would result if the PD were powered through the cable. The PD requests the preferred PoE voltage from the PSE, receives the preferred PoE voltage from the PSE, and operates at the preferred PoE voltage.

24 Claims, 6 Drawing Sheets

(56) References Cited

U.S. PATENT DOCUMENTS

2013/0127481 A1\* 5/2013 Vladan .................. G01R 27/16
  324/713
2013/0241298 A1\* 9/2013 Ishii ........................ H02J 1/108
  307/82

\* cited by examiner

NEGOTIABLE POE VOLTAGE FOR IMPROVED EFFICIENCY BASED ON CABLE AND POWERED DEVICE LOSSES

TECHNICAL FIELD

The present disclosure relates generally to Power-over-Ethernet.

BACKGROUND

A Power-over-Ethernet (PoE) system includes Power Source Equipment (PSE) to provide a PoE voltage over an Ethernet cable to a Powered Device (PD) to power the PD. Conventionally, the PSE supplies the PoE voltage within a limited PoE voltage range, such as 44-57 Volts (V) as defined in the IEEE 802.3 standard. The supplied PoE voltage is generally set to be substantially higher than a voltage actually needed to power circuits in the PD so as to reduce a power transmission loss in the Ethernet cable connecting the PSE to the PD. The PD typically includes a Direct Current-to-Direct Current (DC-DC) voltage converter to convert the higher voltage down to a lower voltage useable by the circuits in the PD, such as 5V or 12V. The DC-DC voltage down-conversion incurs a DC-DC power efficiency conversion loss in the PD.

DESCRIPTION OF EXAMPLE EMBODIMENTS

Overview

Techniques presented herein that enable a powered device (PD) to negotiate with power source equipment (PSE) for a Power-over-Ethernet (PoE) voltage to be supplied to the PD over a cable connected between the PSE and the PD. The PD determines a preferred PoE voltage among multiple candidate PoE voltages offered by the PSE that minimizes a total power loss due to (i) the cable, and (ii) a power loss in the PD due to powering the PD using PoE. The PD requests the preferred PoE voltage from the PSE, receives the preferred PoE voltage from the PSE, and operates at the preferred PoE voltage.

Example Embodiments

Figure 1:
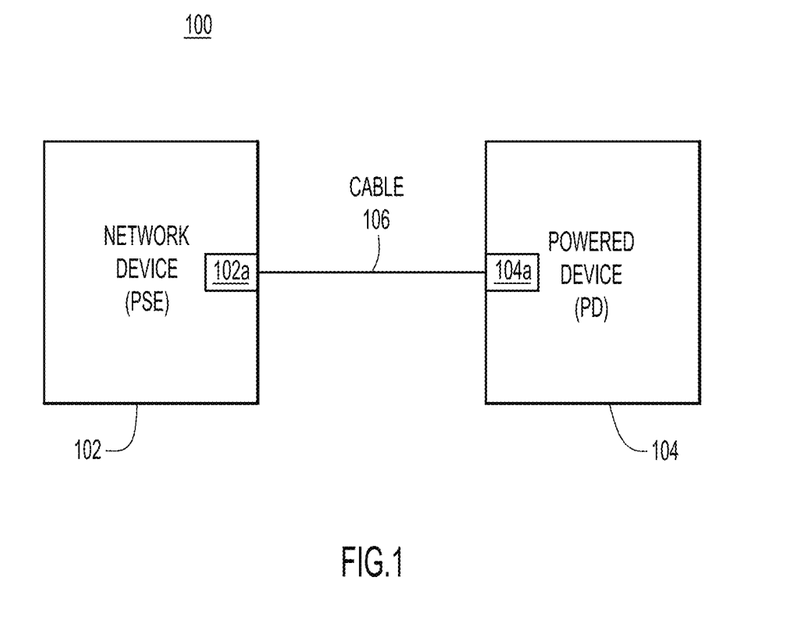
FIG. 1 is a block diagram of an example Power-over-Ethernet (PoE) system in which a Powered Device (PD) negotiates with Power Source Equipment (PSE) for a preferred PSE PoE voltage that improves power efficiency in the system, according to an example embodiment.

Referring first to FIG. 1, there is shown a block diagram of an example system 100 in which negotiable Power-over-Ethernet (PoE) voltage techniques presented herein may be implemented. System 100 includes a network device 102, such a network switch or router, connected to a powered device (PD) 104, such as, an Internet-of-Things (IOT) device, through a PoE Ethernet cable 106 connected between network device port 102a and PD port 104a of the network device and PD, respectively. In other embodiments, network device 102 may be a multi-port system connected to multiple PDs (similar to PD 104) in parallel and may route data between the multiple PDs. Network device 102 and PD 104 may form part of a large collection of distributed network devices and PDs configured as depicted in FIG. 1 and accessible through a communication network (not shown) that includes one or more wide area networks (WANs), such as the Internet, and one or more local area networks (LANs).

Network device 102 and PD 104 exchange bi-directional Ethernet data with each other over Ethernet cable 106. Additionally, network device 102 acts as Power Source Equipment (PSE) to provide PoE (i.e., voltage and current) to PD 104 over Ethernet cable 106, according to techniques presented herein. Thus, network device 102 is also referred to as PSE 102. PSE 102 may provide PoE to PD 104 substantially in accordance with the IEEE 802.3 specification/standard, except where techniques presented herein expand and/or modify the standard, as described below.

In accordance with techniques presented herein, PSE 102 and PD 104 negotiate with each other to select a "preferred" PoE voltage in the PSE with which to power PD 104 that increases an overall power efficiency of system 100 relative to other possible PoE voltages. At a high-level, PSE 102 generates multiple candidate PoE voltages and may inject a selected/requested one of the candidate PoE voltages into Ethernet cable 106 to power PD 104. PSE 102 optionally advertises the multiple candidate PoE voltages to PD 104. PD 104 determines a preferred one of the PoE voltages at which to operate that minimizes a total power loss due to an electrical resistance of Ethernet cable 106 and a power loss of the PD (e.g., due to an operating power efficiency of the PD). PD 104 requests the preferred PoE voltage from PSE 102 and, in response, PSE 102 injects that voltage into Ethernet cable 106 to power the PD.

Figure 2:
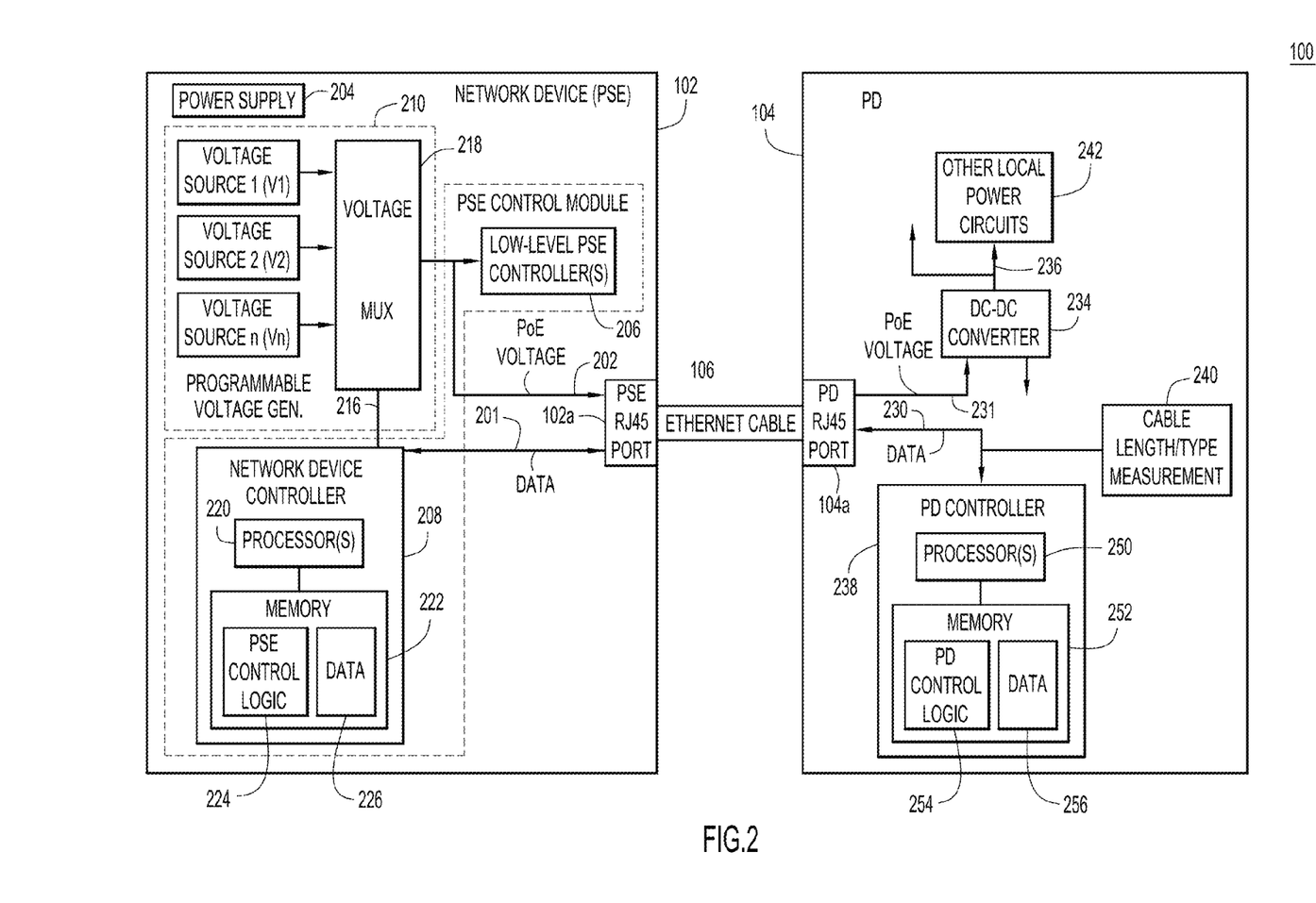
FIG. 2 is a detailed block diagram of the PSE and the PD in the system of FIG. 1, according to an embodiment.

With reference to FIG. 2, there are depicted detailed block diagrams of PSE 102 (i.e., the network device) and PD 104, according to an embodiment. PSE 102 includes PSE port 102a to couple bi-directional Ethernet data 201 to and from Ethernet cable 106 and inject PoE voltage 202 to the cable, a power supply 204 to provide power for circuits of PSE 102 (described below) and PD 104 through the PSE port, a low-level PSE controller 206, a high-level PSE controller 208 (also referred to as a network device controller 208), and a programmable voltage generator 210. Low-level PSE controller 206 and high-level PSE controller 208 are collectively referred to as a PSE control module 212.

PSE port 102a includes a tapped transformer to combine PoE voltage 202 with Ethernet data 201 to be transmitted to PD 104 and inject the combined PoE voltage and data into Ethernet cable 106. Port 102a receives data transmitted from PD 104 over Ethernet cable 106 and provides the received data (at 201) to circuits in PSE 202.

Programmable voltage generator 210 provides a selected one (represented at PoE voltage 202) of multiple candidate PoE voltages to PSE port 102*a* via low-level PSE controller 206 responsive to a control/select signal 216, so as to power PD 106 over Ethernet cable 106 at the selected PoE voltage. In an embodiment, voltage generator 210 includes multiple voltage sources Source 1-Source n to generate and output respective ones of voltages V1-Vn in parallel to a voltage multiplexer 218 of the voltage generator. Responsive to control signal 216, multiplexer 218 selects one of voltages V1-Vn, and outputs the selected one of the voltages as PoE voltage 202 to PSE port 102*a*.

Low-level PSE controller 206 performs PSE operations including, but not limited to, PoE PD detection, optional classification, start-up, operation, and disconnect, which may be performed in accordance with the IEEE 802.3 specification/standard.

High-level PSE/network device controller 208 provides general control over PSE 102, and also implements PSE-side PoE voltage negotiation techniques presented herein. Thus, high-level PSE controller 208 is also referred to herein as an "Intelligence and Communication Center" of PSE 102. High-level controller 208 also generates control signal 216 to control voltage multiplexer 218. In support of this, high-level controller 208 includes a central processing unit (CPU) 220 (also referred to simply as a "processor" 220), and a memory 222. The processor 220 is, for example, a microprocessor or microcontroller that executes software instructions stored in the memory 222 to perform control of PSE 102.

Memory 222 may comprise read only memory (ROM), random access memory (RAM), magnetic disk storage media devices, optical storage media devices, electrical, optical, or other physical/tangible memory storage devices. Thus, in general, the memory 222 may comprise one or more tangible (non-transitory) computer readable storage media (e.g., a memory device) encoded with software comprising computer executable instructions and when the software is executed (by the processor 220) it is operable to control PSE 102 and perform the techniques described herein (from the PSE perspective). For example, memory 222 stores or is encoded with instructions for PSE Control logic 224 to perform operations to perform PoE voltage negotiation and control of programmable voltage generator 210. In addition, memory 222 stores data 226 used and generated by the processor 220 when executing control logic 224. An example of operations performed by PSE Control logic 224 will be described below in connection with FIGS. 3, 5 and 6.

Turning to PD 104, the PD includes PD port 104*a* having associated known circuits (not shown) to present to PSE 102 valid detection and classification signatures responsive to PSE operations, such as detection, classification, and so on. PD port 104*a* couple bi-directional data 230 to and from Ethernet cable 106, and includes a tapped transformer to separate received PoE voltage from data and provide the received PoE voltage (indicated at 231) to a Direct Current-to-Direct Current (DC-DC) voltage converter 234.

DC-DC converter 234 receives PoE voltage 231 and produces a converted voltage 236 useable within PD 104, i.e., the voltage converter converts a voltage level of the PoE voltage from Ethernet cable 106 to a different voltage level (i.e., converted voltage 236). DC-to-DC voltage converter 234 provides converted voltage 236 to power other circuits of power PD 104, including a PD controller 238, an optional cable length/type determiner 240, and other circuits 242 local to the PD.

PD controller 238 provides overall control of PD 104 and also implements PD-side PoE voltage negotiation techniques presented herein. PD controller 238 is also referred to herein as an "Intelligence and Communication Center" of PD 104, which performs operations complementary to the "Intelligence and Communication Center" 208 of PSE 102. In support of this, PD controller 238 includes a central processing unit (CPU) 250 (also referred to simply as a "processor" 250), and a memory 252. The processor 250 is, for example, a microprocessor or microcontroller that executes software instructions stored in the memory 252 to perform control of PD 104. Memory 252 may be configured similarly to memory 222 in PSE 102. Thus in general, the memory 252 may comprise one or more tangible (non-transitory) computer readable storage media (e.g., a memory device) encoded with software comprising computer executable instructions and when the software is executed (by the processor 250) it is operable to perform the techniques described herein. For example, memory 252 stores or is encoded with instructions for PD Control logic 254 to perform operations to perform PoE voltage negotiation from the perspective of PD 104. In addition, memory 252 stores data 256 used and generated by the processor 250 when executing logic 254. An example of operations performed by PD Control logic 254 will be described below in connection with FIGS. 3, 5 and 6.

PD 104 optionally includes PD cable length/type determiner 240 to determine a length and type of Ethernet cable 106 when the cable is connected to PD port 104*a*, and report the determined length to PD controller 238. PD cable length/type determiner 240 may determine the length of cable 106 using any now known or hereafter developed technique. In an embodiment, determiner 240 includes circuitry to determine a length of cable 106 based on time domain reflectometry. In such an embodiment, determiner 240 includes a transmitter to transmit pulses to cable 106 through PD port 104*a*, a receiver to receive pulses reflected from the end of the cable, a clock to record a pulse round-trip travel time on the cable, and a micro-controller to compute cable length based on the round-trip travel time and stored predetermined values for pulse speed.

Conventional PSE provides PSE PoE voltage over a cable to a PD within a relatively small fixed voltage range, such as 44-57V as defined under IEEE 803.2. One reason the PoE voltage range is specified at a relatively higher level than the voltage levels used to actually power circuits in the PD, e.g., 5V or 12V, is to reduce cable power loss due to the current I that flows through the electrical resistance R of the cable, because a higher voltage yields a lower current for constant (PD) power applications, and the lower the current, the lower the power loss in the cable, given by $P=I^2R$. Because many types of PD circuits typically are powered by voltages that are lower than the PoE voltage provided by the PSE, most PDs include a DC-DC voltage converter to down-convert the received PoE voltage to one or more lower voltages, e.g., 5V or 12V. The DC-DC converter suffers a DC-DC conversion efficiency loss associated with converting the higher PoE voltage to the lower PD usable voltage. The bigger the difference between the PoE voltage (from the PSE) and the converted voltage used by the PD, the bigger the DC-DC conversion efficiency loss. Thus, a total or overall loss that results when the PSE powers the PD through the cable combines both the cable loss and the DC-DC conversion efficiency loss.

While IEEE 802.3 specifies a relatively long cable connection of 100 meters (m) for equipment installations, often installations use relatively short cable connections, e.g., less than 40 m. Short cables inherently have less cable loss compared to long cables. In the case of relatively short cables, a power loss that results from a DC-DC conversion efficiency may be substantially greater than a power loss that results from a cable loss. The following two PoE examples illustrate this point. In a first example, a PD is powered by a PSE voltage with the following parameters:
  a. PD power requirement (P)=10 Watts;
  b. PoE voltage at PSE=54V;
  c. Cable length=20 meters with a cable resistance (R)=2.5 Ohms (based on length of cable and resistance per unit length indicated by a type of cable);
  d. PD DC-DC conversion efficiency (to convert from 54V to 24V)=85%; and
  e. The above parameters yield:
    i. System current (I)=186.8 mA (given by I=P/V, where P=10 Watts, and V=voltage at PD=54V–voltage drop across cable (i.e., I*R, where R=2.5 Ohms));
    ii. Cable (power) loss=0.087 Watts (given by $I^2*R$);
    iii. System DC-DC (power) loss=0.15*10 watts=1.5 Watts;
    iv. DC-DC conversion efficiency loss (1.5 Watts)>> cable loss (0.087 Watts); and
    v. Total system power loss (cable loss+DC-DC conversion efficiency)=1.587 Watts In a second example, a PD is powered by a PSE voltage with the following parameters:
  a. PD power requirement=10 Watts;
  b. Voltage at PSE=24V;
  c. Cable length=20 meters (m), which gives a cable resistance=2.5 Ohms; and
  d. PD system voltage=24V (hence no DC-DC needed);
  e. The above will yield:
    i. System current=436.5 mA;
    ii. Cable (power) loss=0.476 Watts;
    iii. System DC-DC conversion efficiency loss=0 (no DC-DC conversion needed);
    iv. Total system power loss=0.476 Watts; and
    v. Overall system loss savings compared to the first example=70%.

As is seen in a comparison between the overall system power losses in the first and second examples above, a drop in the PSE PoE voltage from 54V to 24V results in a 70% reduction in the total system power loss due to the cable loss and the DC-DC conversion efficiency loss. Given that different PSE PoE voltages used to power the PD result in correspondingly different total power losses, techniques presented herein advantageously enable the PSE and PD to negotiate with each other to select a preferred one of multiple candidate PoE voltages (e.g., 54V and 24V) at which to actually power the PD that minimizes the total power loss (due to the cable loss and the DC-DC conversion efficiency loss). In the two voltage examples above, assuming the PSE is able to offer both 54V and 24V PoE voltage options to power the PD, the result of a negotiation between the PSE and PD would be to select the 24V voltage so as to minimize the total system power loss.

In a first embodiment, the PSE-PD negotiation for a preferred PSE PoE voltage occurs at the physical layer. In a second embodiment, the PSE-PD negotiation for a preferred PSE PoE voltage occurs at the data link layer.

Figure 3:
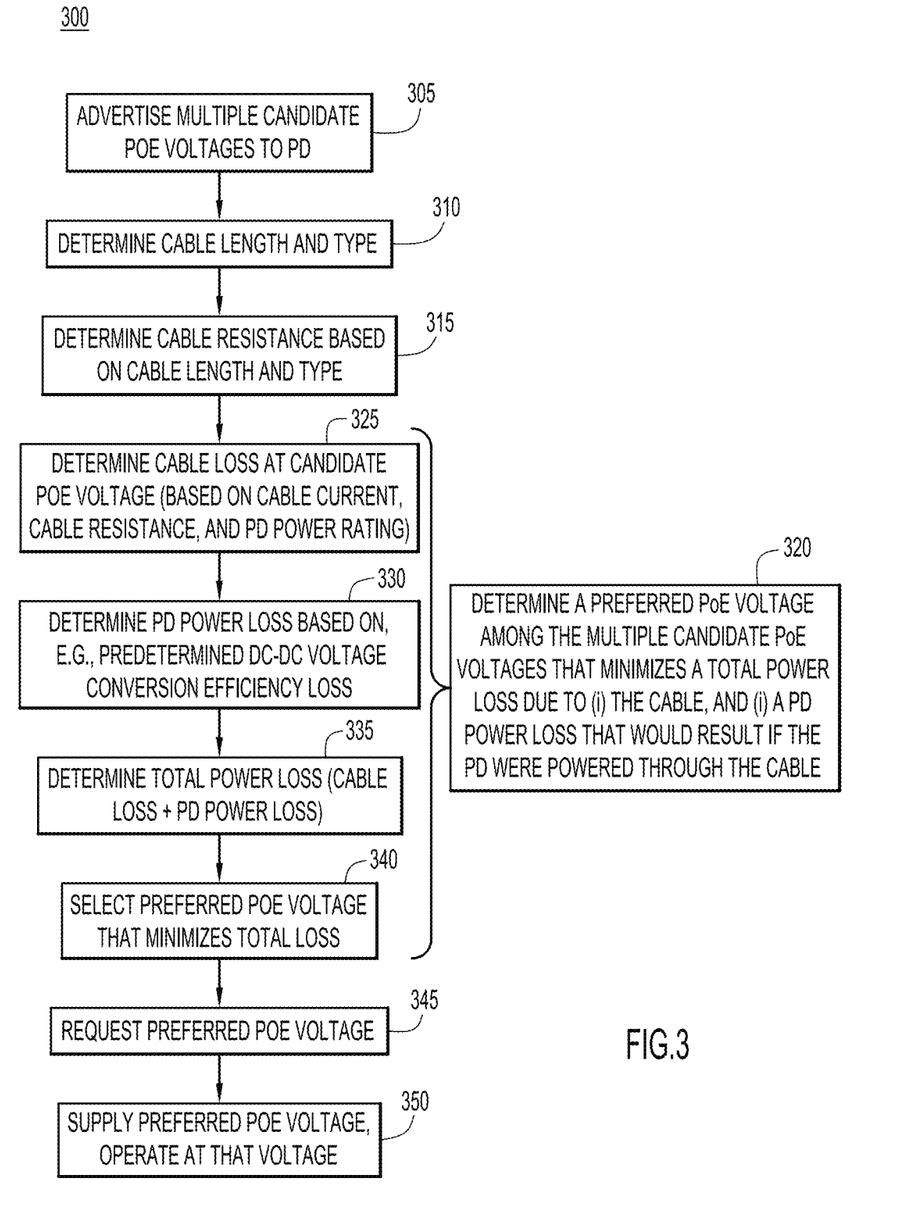
FIG. 3 is a flowchart of an example method of negotiating for a preferred PSE PoE voltage with which to power a PD that improves power efficiency, according to an example embodiment.

With reference to FIG. 3, there is shown a flowchart of an example method 300 of negotiating for a preferred PSE PoE voltage at which to power PD 104 that is performed by PSE 102 and PD 104 in system 100. The PSE-PD negotiating in method 300 may occur at a physical layer (i.e., using a physical layer protocol involving an exchange of voltages and currents), a link layer (i.e., using a link layer data protocol involving an exchange of link layer data protocol messages), or a combination of both. Example physical layer and link layer data protocols will be described below in connection with FIG. 5 and FIG. 6, respectively.

At 305, PSE 102 optionally advertises to PD 104 multiple candidate PoE voltages supported by (i.e., available from) the PSE for powering PD 104. For example, PSE 102 advertises voltages V1-Vn.

Next operations 310 and 315 determine an electrical resistance of Ethernet cable 106.

At 310, a length and a type of cable 106 are determined. In one embodiment, PSE 102 may have access to length and type information stored in memory 22, and provides the length/type information to PD 104 in a data message sent by the PSE. The cable type is associated with a known electrical resistance per unit length, so that once the cable type is known, so too is the cable resistance. Alternatively, PD 104 may determine the cable length based on time domain reflectometry, and then access the cable type (and an associated resistance) in a predetermined cable-type look-up table stored in memory 252 (i.e., as data 256). Other methods of determining cable length and type may be used.

At 315, PD 104 determines an electrical resistance of cable 106 based on the cable length and the cable type.

In another embodiment, PD 104 may skip operation 310 and determine the cable resistance directly using a PD voltage/current sensing technique coupled with messaging from PSE 102. Such a technique may include the following operations: PSE 102 supplies a PoE voltage to PD 104 and sends a data message to the PD informing the PD of the PoE voltage (e.g., "54V"); PD 104 senses/measures a PoE voltage actually received at the PD (e.g., 53.3V) and a corresponding current sunk in the PD as a result of that measured voltage using a voltage/current sense circuit (any known voltage/current sense circuit may be used); PD 104 determines a voltage drop across cable 106 based on the measured voltage and the voltage information sent in the data message (e.g., voltage drop=54V-53.3V=0.7V); and PD 104 determines the cable resistance based on the voltage drop (0.7V) and the measured current using Ohms law.

At a high-level operation 320, PD 104 determines a preferred PoE voltage among multiple candidate PoE voltages (e.g., voltages V1-Vn that were advertised by PSE 102 at 305) that minimizes a total system power loss due to (i) cable 106 (i.e., due to the cable resistance), and iii) a power loss of the PD (i.e., a PD power loss) that would result if the PD were powered through the cable at the PoE voltage. In an example, the PD power loss includes a DC-DC voltage conversion efficiency loss of DC-DC converter 234 in converting the PoE voltage to a lower voltage useable by circuits in PD 104; however, the PD power loss may include other losses in the PD due to an operating efficiency of the PD that is less than 100%.

In an embodiment, high-level operation 320 is performed without actually applying any of the candidate PoE voltages to PD 104. High-level operation includes a sequence of further/low-level operations 325-335 that is repeated for each of the candidate PoE voltages (e.g., for each of voltages V1-Vn), now described.

At 325, PD 104 determines the cable power loss in cable 106 at a given one of the candidate PoE voltages based on a current in the cable caused by that voltage, the cable resistance, and a predetermined PD power rating/requirement of the PD. PD 104 may determine the cable power loss using the technique described above at Sections (e)(i) System Current (I), and (e)(ii), in the first and second powered PD examples.

At 330, PD 104 determines a PD power efficiency loss. PD 104 may determine the PD power efficiency loss using the technique described above in the first and second powered PD examples, e.g., based on the DC-DC voltage conversion efficiency loss.

At 335, PD 104 determines a total power loss as a sum of the cable power loss and the PD power efficiency loss.

Operations 325-335 are repeated for each of the candidate PoE voltages, to produce a total power loss corresponding to each candidate PoE voltage.

At 340, PD 104 selects a preferred one of the PoE voltages (e.g., voltages V1-Vn) that minimizes the total power loss, i.e., the candidate PoE voltage corresponding to the minimum total power loss.

At 345, PD 104 requests the preferred candidate PoE voltage from PSE 102.

At 350, responsive to the request, PSE 102 provides the requested one of the candidate PoE voltages to PD 104. For example, PSE 102 generates control signal 216 so that multiplexer 218 selects the preferred one of voltages V1-Vn and outputs that voltage to PSE port 102*a* (and cable 106).

The above-described embodiment determines the preferred voltage based in part on the power loss in PD 104, e.g., due to DC-DC voltage conversion. Given that PSE 102 typically includes an alternating current (AC)-to-DC voltage converter to perform AC-DC voltage conversion as well as other circuits, the PSE also contributes to overall system power loss. Thus, another embodiment determines a power loss in PSE 102 as well as the power loss in PD 104 and determines a preferred voltage based on a combined PSE, PD, and cable power loss. In this embodiment, PSE 102 may determine the PSE power loss, determine the PD power loss (or receive reports of the PD power loss from PD 104), determine the cable loss (or receive reports of the cable loss from the PD), and determine the preferred voltage based on the combined PSE and PD power loss and the cable loss using techniques described above (simply replacing the PD power loss with the combined PSE and PD power loss).

Given PSEs do have AC-DC converters at least, PSEs also will contribute to system loss and hence shall contribute to system loss calculation and decision making.

In a first embodiment, the PSE-PD negotiation for a preferred PSE PoE voltage occurs at the physical layer. In a second embodiment, the PSE-PD negotiation for a preferred PSE PoE voltage occurs at the data link layer.

Figure 4:
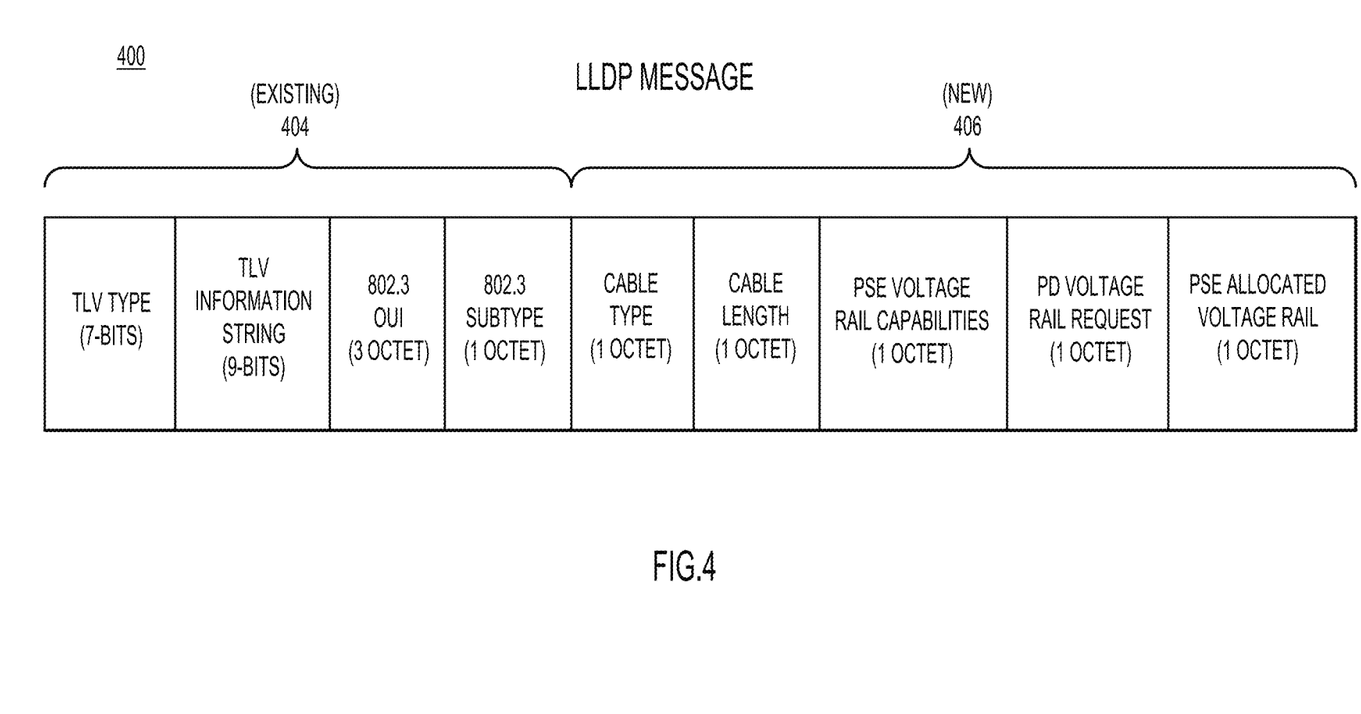
FIG. 4 is an illustration of a data message format for messages that may be used in a link layer data protocol (LLDP) negotiation between a PSE and a PD for a preferred PSE PoE voltage, according to an example embodiment.

As mentioned above, the PSD and PD may negotiate with each other at the link layer using link layer data protocol (LLDP) messages. With reference to FIG. 4, there is an illustration of a LLDP message format 400 for LLDP messages that may be exchanged in a PSD-PD LLDP negotiation. LLDP message format 400 may be used for LLDP messages sent from PSE 102 to PD 104 or vice-versa. LLDP message format 400 includes a set of fields 404 defined in accordance with the existing IEEE 802.3 standard and new fields 406 that modify or extend the standard in accordance with the techniques presented herein. Traversing message header 400 from left-to-right, fields 404 include a type-length-value (TLV) type, a TLV information string, an 802.3 organizationally unique identifier (OUI), and an 802.3 subtype. Fields 406 include:

a. Cable type—e.g., cable type specified as Cat 5e, Cat 6, and the like, with a known resistance per unit length, which may be predetermined at either PSE 102 or PD 104 and thus accessible in either memory 222 or 238 (e.g., via programmed or manual entry into either the PSE or PD memories);

b. Cable Length—The length of cable 106 between PSE 102 and PD 104. As mentioned above, cable type and length are used together to determine cable electrical resistance and the cable power loss that results from that resistance. Cable length (and type) can be set at either PSE 102 or PD 104. Cable length may be (i) determined based on voltages at PSE 102 and PD 104, or (ii) determined by time domain reflectometry;

c. PSE voltage capabilities (where "voltage" may also referred to as "voltage rail" or "voltage level"). PSE 102 advertises the PoE voltages (rails/levels) it can output, e.g., voltages V1-Vn. PSE 102 supports at least one voltage (as defined in the IEEE 802.3 standard), but ideally supports many different voltages over a range that extends beyond that defined in the IEEE 802.3 standard;

d. PD voltage (rail) request—Sent from PD 104 to PSE 102 to request a particular voltage at the PSE output (i.e., the preferred PoE voltage), based on those advertised in the PSE voltage capabilities field; and e. PSE allocated voltage (rail)—PSE 102 sets this field with the value of the PoE voltage output by the PSE. Once this field changes, PD 104 can adjust the local PD circuits to be powered from the new PSE PoE voltage.

Figure 5:
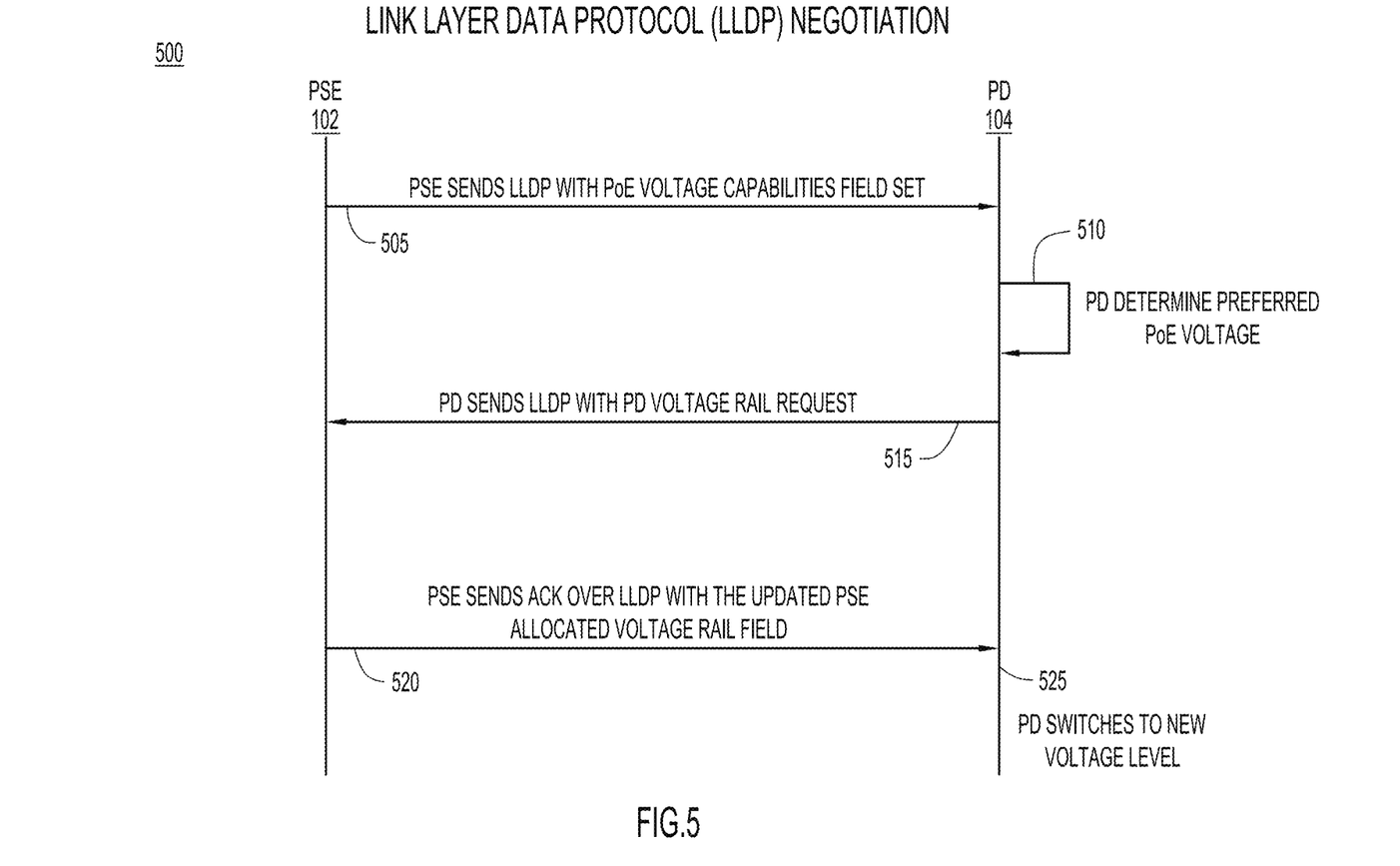
FIG. 5 is an example LLDP negotiation (also referred to as a "message handshake") corresponding to the method of FIG. 3 that uses LLDP messages formatted according to the LLDP message format of FIG. 4, according to an example embodiment.

With reference to FIG. 5, there is depicted an example LLDP negotiation or message handshake 500 corresponding to method 300 (i.e., that may be used to implement method 300) that uses messages formatted in accordance with LLDP message format 400. LLDP negotiation 500 assumes initially that (i) that PD 104 is powered via a basic PoE voltage or local battery so that LLDP negotiation 500 can occur, and (ii) there is sufficient information (either at PSE 102 or PD 104) from which cable electrical resistance can be determined, such as cable length and type, or time domain reflectometry information, or manually entered information. Also, the above described PD voltage/current sense technique may be used to determine the cable resistance.

At 505, PSE 102 sends to PD 104 an LLDP message advertising multiple candidate PoE voltages (e.g., voltages V1-Vn) in the PSE voltage capabilities field.

At 510, PD 104 determines a preferred one of the advertised PoE voltages at which to operate based on determined cable power loss (from cable length and type, and PD power rating), and PD power loss. Operation 510 corresponds to operation 320 described above in connection with FIG. 3.

At 515, PD 104 sends an LLDP message requesting the preferred PoE voltage (referred to as "PD voltage rail" in FIG. 5).

At 520, in response to the request message at 515, PSE 102 sends to PD 104 an LLDP "ACK" message that acknowledges the PSE is able to supply the requested voltage and that has the PSE allocated voltage (rail) field set to indicate the preferred voltage.

At 525, PSE 102 supplies the preferred/requested PoE voltage and PD 104 operates at the new PoE voltage (which is new with respect to the basic voltage initially supplied to enable the PD to perform negotiation 500).

Figure 6:
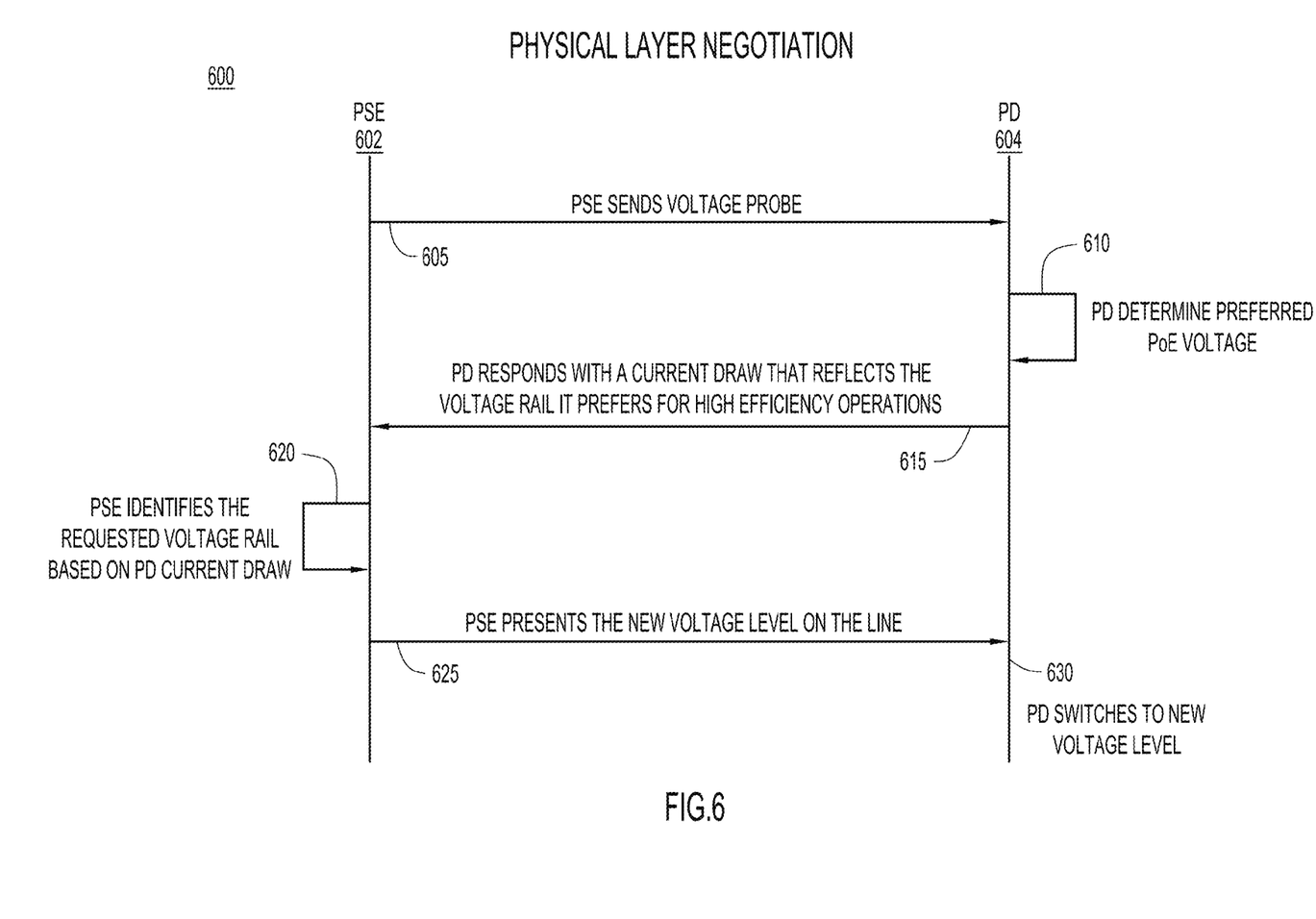
FIG. 6 is an example physical layer protocol/negotiation corresponding to the method of FIG. 3, according to an example embodiment.

With reference to FIG. 6, there is depicted an example physical layer negotiation 600 corresponding to method 300. Similar to negotiation 500, negotiation 600 assumes initially that cable length and type have been determined, or that the cable resistance is determined.

At 605, PSE 102 presents a probe voltage to PD 604.

At 610, PD 104 determines a preferred PoE voltage based on the probe voltage.

At 615, PD 104 sinks a current from PSE 102 based on the probe voltage and that is representative of the preferred PoE voltage. For example, a sunk current of 5 milliamps (mA) indicates a preferred PoE voltage of 20V, while a sunk current of 3 mA indicates a preferred PoE voltage of 50V.

At 620, responsive to the current sunk at 615, PSE 102 identifies and selects the preferred PoE voltage, if the preferred PoE voltage is supported by the PSE.

At 625, if the preferred PoE voltage is supported, PSE 102 presents the preferred PoE voltage to PD 604.

If the requested/preferred voltage is not supported in PSE 102, the PSE may present a new probe voltage, such as a default voltage, to PD 104, at which time the PD may determine a new preferred voltage to request from the PSE.

In summary, in one form, a method is provided comprising: at a powered device (PD) configured to receive a Power-over-Ethernet (PoE) voltage to power the PD over a cable from a Power Source Equipment (PSE) that is configured to output a requested one of multiple candidate PoE voltages to the cable: determining a preferred PoE voltage among the multiple candidate PoE voltages that minimizes a total power loss due to (i) the cable, and (ii) a power loss of the PD that would result if the PD were powered through the cable; requesting the preferred PoE voltage from the PSE; receiving the preferred PoE voltage from the PSE; and operating at the preferred PoE voltage.

In summary, in another form, an apparatus is provided comprising: a powered device (PD) configured to receive a Power-over-Ethernet (PoE) voltage to power the PD over a cable from a Power Source Equipment (PSE) that is configured to output a requested one of multiple candidate PoE voltages to the cable, wherein the PD includes a controller configured to: determine a preferred PoE voltage among the multiple candidate PoE voltages that minimizes a total power loss due to (i) the cable, and (ii) a power loss of the PD that would result if the PD were powered through the cable; request the preferred PoE voltage from the PSE; receive the preferred PoE voltage from the PSE; and operate at the preferred PoE voltage.

In summary, in yet another form, a system is provided comprising: a powered device (PD) configured to receive a Power-over-Ethernet (PoE) voltage to power the PD over a cable, the PD including a PD controller; and Power Source Equipment (PSE), including: a voltage generator to generate multiple candidate PoE voltages and output a selected one of the PoE voltages to the cable to power the PD; and a PSE controller coupled to the voltage generator; wherein the PD and the PSE are configured to negotiate with each other to: determine a preferred PoE voltage among the multiple candidate PoE voltages that minimizes a total power loss due to (i) the cable, and (ii) a PD power loss that would result if the PD were powered by the PSE through the cable; and cause the PSE to provide the preferred PoE voltage to the cable to power the PD.

The above description is intended by way of example only. Various modifications and structural changes may be made therein without departing from the scope of the concepts described herein and within the scope and range of equivalents of the claims.

What is claimed is:

1. A method comprising:
   at a powered device (PD) configured to receive a Power-over-Ethernet (PoE) voltage to power the PD over a cable from a Power Source Equipment (PSE) that is configured to output a requested one of multiple candidate PoE voltages to the cable:
   determining for each candidate PoE voltages, respectively:
      a power loss in the cable that would result from the candidate PoE voltage;
      a power loss in the PD that would result if the PD were powered through the cable with the candidate PoE voltage, the power loss in the PD equal to a product of a predetermined power rating of the PD and a voltage conversion efficiency loss associated with converting a voltage received by the PD to an operating voltage used to operate circuits in the PD; and
      a total power loss as a sum of the power losses of the cable and the PD;
   selecting as a preferred PoE voltage the candidate PoE voltage that minimizes the total power loss;
   requesting the preferred PoE voltage from the PSE;
   receiving the preferred PoE voltage from the PSE; and
   operating at the preferred PoE voltage.

2. The method of claim 1, wherein the respective cable power loss is determined based on the predetermined power rating of the PD, the PoE voltage, and an electrical resistance of the cable.

3. The method of claim 2, wherein the determining the PD power loss includes determining the PD power loss based on the predetermined power rating of the PD and a Direct Current-to-Direct Current (DC-DC) efficiency loss associated with converting the PoE voltage to the operating voltage used to operate the circuits in the PD.

4. The method of claim 2, further comprising:
   determining a cable length;
   determining a cable type that indicates an electrical resistance per unit length; and
   determining the electrical resistance of the cable based on the cable length and the cable type.

5. The method of claim 4, further comprising, at the PD:
   receiving from the PSE one or more data messages that specifies the multiple candidate PoE voltages as voltages that the PSE is able to provide to the PD;
   after the determining, sending a data message to the PSE requesting the preferred PoE voltage; and
   receiving from the PSE an acknowledgment of the request.

6. The method of claim 5, further comprising, at the PSE:
   sending to the PD the one or more data messages that specifies the multiple candidate PoE voltages as voltages that the PSE is able to provide to the PD;
   receiving from the PD the data message requesting the preferred PoE voltage; and
   responsive to the data message requesting the preferred PoE voltage:
      sending the acknowledgement; and
      outputting the preferred PoE voltage to the PD.

7. The method of claim 4, wherein the cable length and cable type is contained in the data message received from the PSE.

8. The method of claim 4, wherein the determining a cable length includes determining the cable length using a time domain reflectometry technique performed at the PD.

9. The method of claim 4, further comprising:
   sending a probe voltage to the PD;
   at the PD, responsive to the probe voltage, sinking a current from the PSE indicative of the preferred PoE voltage; and at the PSE, sensing the sinking current and responsive thereto, presenting the preferred PoE voltage to the PD.

10. The method of claim 1, further comprising, at the PSE:
generating the multiple candidate PoE voltages; and
responsive to the requesting from the PD, selecting and outputting to the PD the preferred one of the multiple candidate PoE voltages.

11. The method of claim 1, further comprising performing the determining, for each of the candidate voltages, the power loss in the cable, the power loss in the PD, and the total power loss, without applying any of the candidate PoE voltages to the PD.

12. An apparatus comprising:
a powered device (PD) configured to receive a Power-over-Ethernet (PoE) voltage to power the PD over a cable from a Power Source Equipment (PSE) that is configured to output a requested one of multiple candidate PoE voltages to the cable, wherein the PD includes a controller to:
determine for each candidate PoE voltage, respectively:
a power loss in the cable that would result from the candidate PoE voltage;
a power loss in the PD that would result if the PD were powered through the cable with the candidate PoE voltage, the power loss in the PD equal to a product of a predetermined power rating of the PD and a voltage conversion efficiency loss associated with converting a voltage received by the PD to an operating voltage used to operate circuits in the PD; and
a total power loss as a sum of the power losses of the cable and the PD;
select as a preferred PoE voltage the candidate PoE voltage that minimizes the total power loss;
request the preferred PoE voltage from the PSE;
receive the preferred PoE voltage from the PSE; and
operate at the preferred PoE voltage.

13. The apparatus of claim 12, wherein the controller determines a respective cable power loss by determining the cable power loss based on the predetermined power rating of the PD, the PoE voltage, and an electrical resistance of the cable.

14. The apparatus of claim 13, wherein the PD includes a Direct Current-to-Direct Current (DC-DC) converter to convert the received PoE voltage to the operating voltage used to operate the PD.

15. The apparatus of claim 13, wherein the controller further:
determines a cable length;
determines a cable type that indicates a electrical resistance per unit length; and
determines the electrical resistance of the cable based on the cable length and the cable type.

16. The apparatus of claim 15, wherein the controller further:
receives from the PSE a data message that indicates the multiple candidate PoE voltages as voltages that the PSE is able to provide to the PD;
after the preferred PoE voltage is determined, sends a data message to the PSE requesting the preferred PoE voltage; and
receives from the PSE an acknowledgment of the request.

17. The apparatus of claim 16, wherein the controller determines the cable length and the cable type from information contained in the data message received from the PSE.

18. The method of claim 11, further comprising performing the selecting without applying any of the candidate PoE voltages to the PD.

19. A system comprising:
a powered device (PD) configured to receive a Power-over-Ethernet (PoE) voltage to power the PD over a cable, the PD including a PD controller; and
Power Source Equipment (PSE), including:
a voltage generator to generate multiple candidate PoE voltages and output a selected one of the PoE voltages to the cable to power the PD; and
a PSE controller coupled to the voltage generator, wherein:
the PSE is configured to advertise the multiple candidate PoE voltages to the PD; the PD is configured to:
determine for each candidate PoE voltage, respectively:
a power loss in the cable that would result from the candidate PoE voltage;
a power loss in the PD that would result if the PD were powered through the cable with the candidate PoE voltage, the power loss in the PD equal to a product of a predetermined power rating of the PD and a voltage conversion efficiency loss associated with converting a voltage received by the PD to an operating voltage used to operate circuits in the PD; and
a total power loss as a sum of the power losses of the cable and the PD;
select as a preferred PoE voltage the candidate PoE voltage that minimizes the total power loss; and
the PD and the PSE are configured to negotiate with each other to cause the PSE to provide the preferred PoE voltage to the cable to power the PD.

20. The system of claim 19, wherein:
the PD further requests the preferred PoE voltage from the PSE; and
responsive to the request from the PD, the PSE selects and outputs the preferred PoE to power the PD.

21. The system of claim 20, wherein:
the PSE advertises by sending a data message to the PD that lists the multiple candidate PoE voltages as voltages that the PSE is able to provide to the PD; and
responsive to the request from the PD, the PSE further sends an acknowledgement to the PD.

22. The system of claim 20, wherein the PD further determines the respective cable power loss based on the predetermined power rating of the PD, the PoE voltage, and an electrical resistance of the cable.

23. The system of claim 22, wherein the PD further determines the PD power loss based on the predetermined power rating of the PD and a Direct Current-to-Direct Current (DC-DC) efficiency loss associated with converting the PoE voltage to the operating voltage used to operate the circuits in the PD.

24. The system of claim 19, wherein the PSE determines the preferred PoE voltage based on a total power loss due to the cable, the PD power loss that would result if the PD were powered by the PSE through the cable, and a PSE power loss.

* * * * *